(12) United States Patent
Wortel et al.

(10) Patent No.: US 10,097,140 B1
(45) Date of Patent: Oct. 9, 2018

(54) METHOD AND SYSTEM FOR AMPLIFIER CALIBRATION

(71) Applicant: NXP B.V., Eindhoven (NL)

(72) Inventors: Klaas Wortel, Eindhoven (NL); Henri Verhoeven, Someren (NL); Theo Thurlings, Steyl (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/612,871

(22) Filed: Jun. 2, 2017

(51) Int. Cl.
*H03F 1/30* (2006.01)
*H03F 3/04* (2006.01)

(52) U.S. Cl.
CPC .............. *H03F 1/304* (2013.01); *H03F 3/04* (2013.01); *H03F 2200/375* (2013.01); *H03F 2200/447* (2013.01)

(58) Field of Classification Search
CPC ....................................................... H03F 1/30
USPC ............................... 330/289, 124 R, 295, 51
See application file for complete search history.

(56) References Cited

U.S. PATENT DOCUMENTS

| | | | | |
|---|---|---|---|---|
| 6,657,487 B2 * | 12/2003 | Lauffenburger | ........ | H03F 1/303 330/124 R |
| 8,324,964 B2 * | 12/2012 | Retz | ...................... | H03F 1/0277 330/124 R |
| 8,653,886 B2 * | 2/2014 | Hellberg | ............... | H03F 1/0222 330/124 R |
| 8,710,927 B2 * | 4/2014 | Kamitani | .............. | H03F 1/0277 330/124 R |
| 8,749,305 B2 * | 6/2014 | Retz | ...................... | H03F 1/0277 330/124 R |

\* cited by examiner

*Primary Examiner* — Henry Choe (57) ABSTRACT

Embodiments of a method for amplifier calibration and an amplifier system are described. In one embodiment, a method for amplifier calibration involves amplifying an input signal using a first amplifier connected between an input terminal and an output terminal to generate an output signal and digitally performing offset calibration on a second amplifier coupled in parallel with the first amplifier between the input terminal and the output terminal while amplifying the input signal using the first amplifier. Other embodiments are also described.

20 Claims, 7 Drawing Sheets

METHOD AND SYSTEM FOR AMPLIFIER CALIBRATION

Embodiments of the invention relate generally to electronic devices and methods for operating electronic devices, and, more particularly, to methods for amplifier calibration and amplifier systems.

In an amplifier, voltage offset may occur due to a mismatch of components within the amplifier, which may originate from intrinsic offset due to process variations in the amplifier or from stress related factors in the amplifier such as package stress in the amplifier. Intrinsic parameter offset within an amplifier can often be removed by calibrating (e.g., trimming) the amplifier in a manufacturing facility at a specific temperature. Package stress related offset often requires multiple calibrations (e.g., trimmings) or continuous calibrations across a temperature range. However, amplifier calibrations at multiple temperatures within a manufacturing facility is often time consuming and consequently rather expensive.

SUMMARY

Embodiments of a method for amplifier calibration and an amplifier system are described. In one embodiment, a method for amplifier calibration involves amplifying an input signal using a first amplifier connected between an input terminal and an output terminal to generate an output signal and digitally performing offset calibration on a second amplifier coupled in parallel with the first amplifier between the input terminal and the output terminal while amplifying the input signal using the first amplifier. Other embodiments are also described.

In an embodiment, digitally performing offset calibration on the second amplifier involves reducing a temperature-based offset in the second amplifier.

In an embodiment, reducing the temperature-based offset in the second amplifier involves adjusting the second amplifier to reduce temperature-based offsets in the second amplifier at multiple temperatures.

In an embodiment, digitally performing offset calibration on the second amplifier involves generating a calibration code for reducing a temperature-based offset in the second amplifier at a particular temperature.

In an embodiment, the method further involves connecting the first amplifier to the input terminal and the output terminal and simultaneously disconnecting the second amplifier from the input terminal and the output terminal.

In an embodiment, the method further involves connecting two inputs of the second amplifier to each other.

In an embodiment, digitally performing offset calibration on the second amplifier involves generating a calibration code for reducing a temperature-based offset in the second amplifier at a particular temperature based on an output from the second amplifier.

In an embodiment, digitally performing offset calibration on the second amplifier further involves adjusting the second amplifier using the calibration code in response to a positive edge of the output from the second amplifier.

In an embodiment, the method further involves amplifying a second input signal using the second amplifier to generate a second output signal and digitally performing offset calibration on the first amplifier while amplifying the second input signal using the second amplifier.

In an embodiment, an amplifier system includes a first amplifier connected between an input terminal and an output terminal, a first switch device connected serially with the first amplifier between the input terminal and the output terminal, a second amplifier coupled in parallel with the first amplifier between the input terminal and the output terminal, a second switch device connected serially with the second amplifier between the input terminal and the output terminal, and a digital control device configured to control the first switch device to cause an input signal to be amplified using the first amplifier to generate an output signal and control the second switch device and the second amplifier to digitally perform offset calibration on the second amplifier while amplifying the input signal using the first amplifier.

In an embodiment, the digital control device is further configured to reduce a temperature-based offset in the second amplifier.

In an embodiment, the digital control device is further configured to adjust the second amplifier to reduce temperature-based offsets in the second amplifier at multiple temperatures.

In an embodiment, the digital control device is further configured to generate a calibration code for reducing a temperature-based offset in the second amplifier at a particular temperature.

In an embodiment, the digital control device is further configured to control the first switch device to connect the first amplifier to the input terminal and the output terminal and control the second switch device to simultaneously disconnect the second amplifier from the input terminal and the output terminal.

In an embodiment, the digital control device is further configured to control the second switch device to connect two inputs of the second amplifier to each other.

In an embodiment, the digital control device is further configured to generate a calibration code for reducing a temperature-based offset in the second amplifier at a particular temperature based on an output from the second amplifier.

In an embodiment, the digital control device is further configured to adjust the second amplifier using the calibration code in response to a positive edge of the output from the second amplifier.

In an embodiment, the digital control device is further configured to control the second switch device to amplify a second input signal using the second amplifier to generate a second output signal and control the first switch device and the first amplifier to digitally perform offset calibration on the first amplifier while amplifying the second input signal using the second amplifier.

In an embodiment, an amplifier system includes a first amplifier connected between an input terminal and an output terminal, a first switch connected between the input terminal and the first amplifier, a second switch connected between the first amplifier and the output terminal, a second amplifier coupled in parallel with the first amplifier between the input terminal and the output terminal, a third switch connected between the input terminal and the second amplifier, a fourth switch connected between the second amplifier and the output terminal, and a digital control device configured to control the first and second switches to cause an input signal to be amplified using the first amplifier to generate an output signal and control the third and fourth switches and the second amplifier to digitally perform offset calibration on the second amplifier while amplifying the input signal using the first amplifier.

In an embodiment, the digital control device is further configured to control the third and fourth switches to amplify a second input signal using the second amplifier to generate a second output signal and control the first and second switches and the first amplifier to digitally perform offset calibration on the first amplifier while amplifying the second input signal using the second amplifier.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
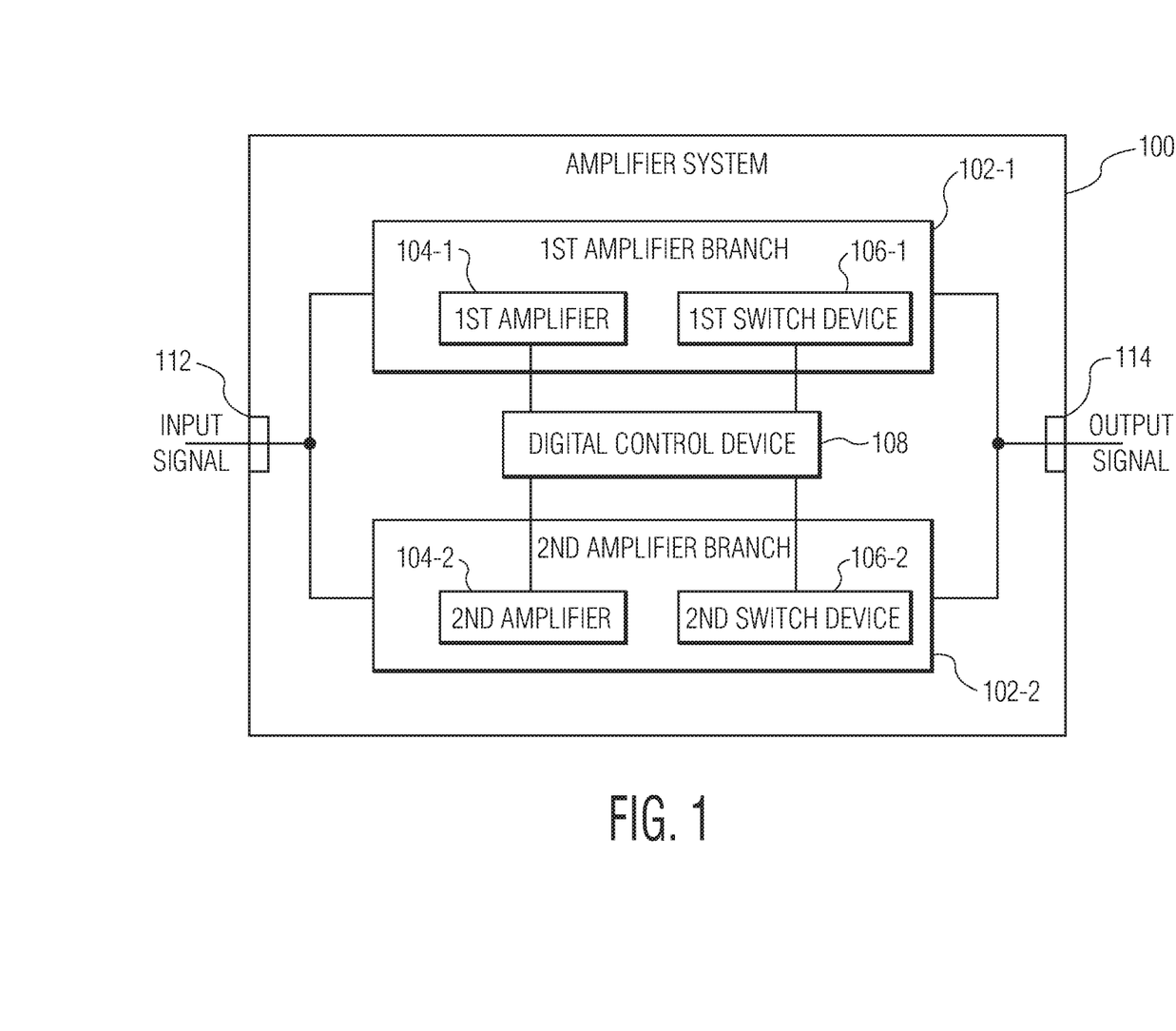
FIG. 1 is a schematic block diagram of an amplifier system in accordance with an embodiment of the invention.

FIG. 1 is a schematic block diagram of an amplifier system 100 in accordance with an embodiment of the invention. The amplifier system amplifies an input signal to generate an output signal. The amplifier system can be used in various applications, such as automotive applications, communications applications, industrial applications, medical applications, computer applications, and/or consumer or appliance applications. In some embodiments, the amplifier system is included in a computing device, such as a smartphone, a tablet computer, a laptop, etc. In the embodiment depicted in FIG. 1, the amplifier system includes a first amplifier branch 102-1 connected between an input terminal 112 and an output terminal 114, a second amplifier branch 102-2 connected between the input terminal and the output terminal and in parallel with the first amplifier branch, and a digital control device 108 connected to the first and second amplifier branches. Although the amplifier system is shown in FIG. 1 as including certain circuit elements, in other embodiments, the amplifier system may include one or more additional circuit elements. For example, the amplifier system may include one or more amplifier branches. In another example, the amplifier system may include one or more feedback networks connected to the first and second amplifier branches.

In the embodiment depicted in FIG. 1, the first amplifier branch 102-1 includes a first amplifier 104-1 and a first switch device 106-1 connected serially with the first amplifier between the input terminal 112 and the output terminal 114. The first amplifier is configured to perform signal amplification on the input signal or perform an amplifier calibration operation. The first switch device is used to connect or to disconnect the first amplifier from the input terminal and/or the output terminal. For example, the first switch device is used to connect the first amplifier to the input terminal and to the output terminal for amplifying the input signal into the output signal. The first switch device may also be used to disconnect the first amplifier from the input terminal or the output terminal for performing an amplifier calibration operation on the first amplifier.

In the embodiment depicted in FIG. 1, the second amplifier branch 102-2 includes a second amplifier 104-2 and a second switch device 106-2 connected serially with the second amplifier between the input terminal 112 and the output terminal 114. The second amplifier is configured to perform signal amplification on the input signal or perform an amplifier calibration operation. The second switch device is used to connect or to disconnect the second amplifier from the input terminal and/or the output terminal. For example, the second switch device is used to connect the second amplifier to the input terminal and to the output terminal for amplifying the input signal into the output signal. The second switch device may also be used to disconnect the second amplifier from the input terminal or the output terminal for performing an amplifier calibration operation on the second amplifier.

In some embodiments, the input terminal 112 and the output terminal 114 are electrical terminals of the amplifier system 100, such as electrical contact pads or electrical contact pins of the amplifier system. For example, the amplifier system is packaged as an IC chip and the input terminal and the output terminal are contact pins on the IC chip.

The digital control device 108 is configured to control the first and second amplifier branches 102-1, 102-2 of the amplifier system 100. The digital control device can be implemented on a substrate, such as a semiconductor wafer. In an embodiment, the digital control device is packaged as a semiconductor IC chip. The digital control device may be implemented in suitable logical circuits. In some embodiments, the digital control device is implemented as a microcontroller. The digital control device may be configured to cause one of the first and second amplifier branches of the amplifier system to amplify the input signal into the output signal and to digitally perform offset calibration on the other one of the first and second amplifier branches of the amplifier system simultaneously. In some embodiments, the digital control device is configured to control one of the first and second switch devices 106-1, 106-2 to cause an input signal to be amplified using a corresponding one of the amplifiers 104-1, 104-2 to generate an output signal and to control the other one of the first and second switch devices 106-1, 106-2 and the other one of the amplifiers 104-1, 104-2 to digitally perform offset calibration on the other one of the amplifiers 104-1, 104-2 while amplifying the input signal using the corresponding one of the amplifiers 104-1, 104-2. In these embodiments, the amplifiers 104-1, 104-2 are trimmable and the digital control device implements a trimming algorithm for the trimmable amplifiers 104-1, 104-2 to calibrate the trimmable amplifiers 104-1, 104-2. Specifically, while one of the first and second amplifiers 104-1, 104-2 is in use, the other one of the first and second amplifiers 104-1, 104-2 is automatically calibrated. At any given time, the input signal received at the input terminal 112 is amplified by an amplifier within the amplifier system. Consequently, the amplifier system depicted in FIG. 1 can be used in applications that do not allow amplifier(s) to be disconnected even temporarily for calibration.

In some embodiments, the digital control device 108 controls one of the first and second amplifiers 104-1, 104-2 to amplify the input signal into the output signal and digitally performs offset calibration on the other one of the first and second amplifiers 104-1, 104-2 simultaneously in discrete steps. The digital control device may be configured to control the first switch device 106-1 to cause a first input signal to be amplified using the first amplifier 104-1 to generate a first output signal and to control the second switch device 106-2 and the second amplifier 104-2 to digitally perform offset calibration on the second amplifier while amplifying the input signal using the first amplifier. The digital control device may also configured to control the second switch device to amplify a second input signal using the second amplifier to generate a second output signal and to control the first switch device and the first amplifier to digitally perform offset calibration on the first amplifier while amplifying the second input signal using the second amplifier. The digital control device may be configured to reduce a temperature-based offset in the amplifier under calibration. The digital control device may perform multiple calibrations (e.g., trimmings) or continuous calibrations on the first and second amplifiers 104-1, 104-2 across a temperature range. For example, the digital control device may be configured to adjust the amplifier under calibration to reduce temperature-based offsets in the amplifier under calibration at different temperatures. The digital control device may be configured to generate a calibration code for reducing a temperature-based offset in the amplifier under calibration at a particular temperature. The calibration code may be a bit sequence of a particular length (e.g., 5 bits or other suitable number of bits). The digital control device may be configured to control one of the first and second switch devices 106-1, 106-2 to connect the amplifier under calibration to the input terminal 112 and the output terminal 114 and control the other one of the first and second switches to simultaneously disconnect the other amplifier from the input terminal and the output terminal. The digital control device may be configured to control one of the first and second switch devices 106-1, 106-2 to connect two inputs of the amplifier under calibration to each other. The digital control device may be configured to generate a calibration code for reducing a temperature-based offset in the amplifier under calibration at a particular temperature based on an output from the amplifier under calibration. The digital control device may be configured to adjust the amplifier under calibration using the calibration code in response to a positive edge of the output from the amplifier under calibration. The digital control device can reduce or cancel the intrinsic parameter offset as well as the package stress related offset within each of the first and second amplifiers 104-1, 104-2 while the input signal is amplified into the output signal. Compared to an amplifier that requires temperature dependent amplifier calibrations within a manufacturing facility, which is often time consuming and expensive, the amplifier system 100 depicted in FIG. 1 uses a built-in component, i.e., the digital control device 108, to perform amplifier calibrations while performing signal amplification at the same time. Consequently, compared to an amplifier that requires amplifier calibrations within a manufacturing facility, the amplifier system 100 depicted in FIG. 1 can use amplifiers with reduced offset requirements, which occupy less circuit area.

Figure 2:
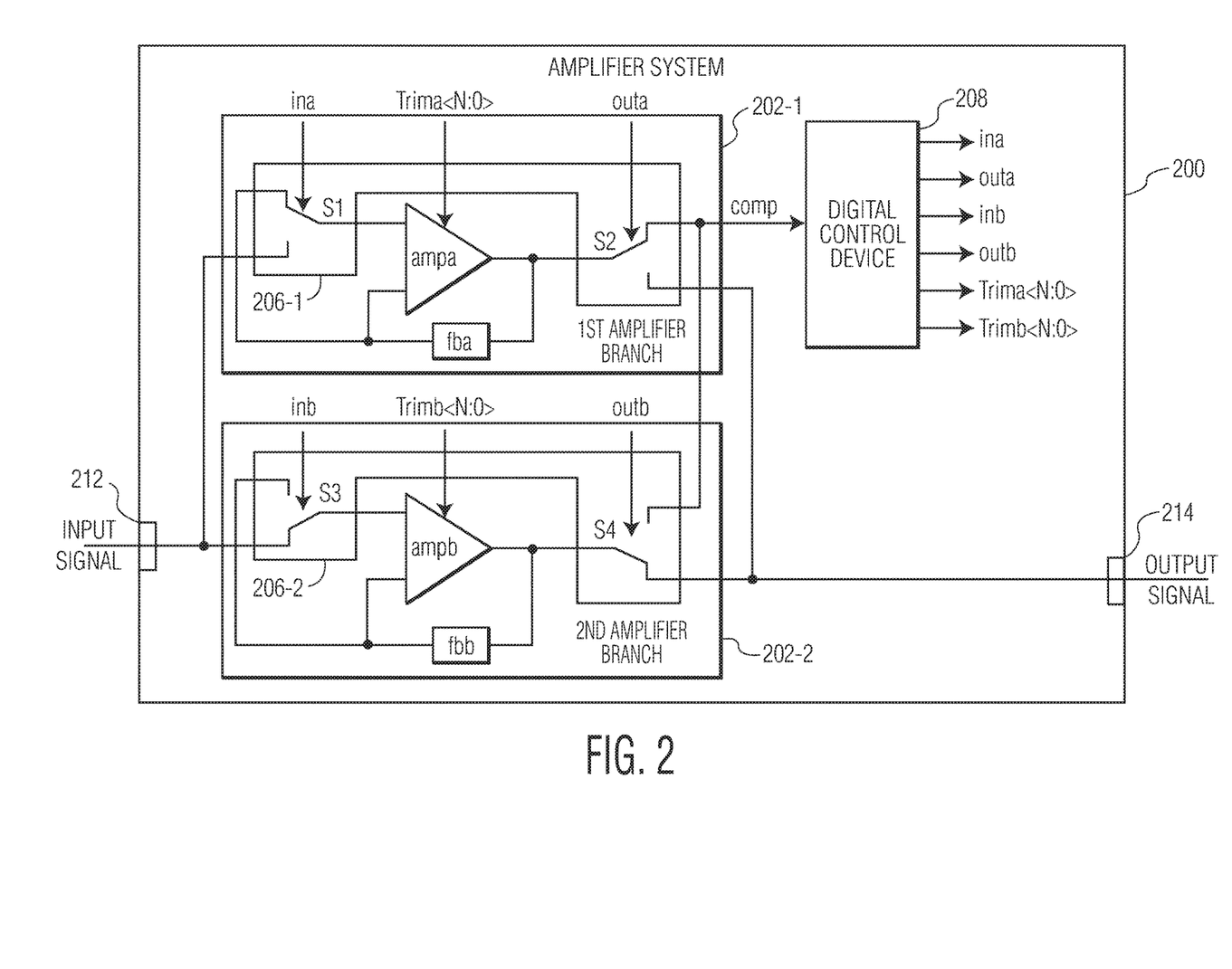
FIG. 2 depicts an embodiment of the amplifier system of FIG. 1.

FIG. 2 depicts an embodiment of the amplifier system 100 of FIG. 1. In the embodiment depicted in FIG. 2, an amplifier system 200 includes a first amplifier branch 202-1 connected between an input terminal 212 and an output terminal 214, a second amplifier branch 202-2 connected between the input terminal and the output terminal and in parallel with the first amplifier branch, and a digital control device 208 connected to the first and second amplifier branches. The first amplifier branch 202-1 includes a first amplifier, "ampa," having a feedback network, "fba," and a first switch device 206-1 having two switches, "S1," "S2." The second amplifier branch 202-2 includes a second amplifier, "ampb," having a feedback network, "fbb," and a second switch device 206-2 having two switches, "S3," "S4." The amplifier system 200 in FIG. 2 is a possible implementation of the amplifier system 100 depicted in FIG. 1. For example, the first and second amplifier branches 202-1, 202-2, the input terminal 212, the output terminal 214, the digital control device 208, the amplifiers, ampa, ampb, and the switch devices 206-1, 206-2 depicted in FIG. 2 are embodiments of the first and second amplifier branches 102-1, 102-2, the input terminal 112, the output terminal 114, the digital control device 108, the amplifiers, 104-1, 104-2, and the switch devices 106-1, 106-2 depicted in FIG. 1, respectively. However, the amplifier system 100 depicted in FIG. 1 can be implemented differently from the amplifier system 200 depicted in FIG. 2.

In the embodiment depicted in FIG. 2, the amplifier, ampa, is connected to the input terminal 212 through the switch, S1, and connected to the output terminal 214 through the switch, S2. The amplifier, ampb, is connected to the input terminal through the switch, S3, and connected to the output terminal through the switch, S4. The digital control device generates digital control signals, "ina," "outa," "inb," "outb," "Trima<N:0>," (N being a positive integer) and "Trimb<N:0>," for the switches, S1, S2, S3, S4, and the amplifiers, ampa, ampb, respectively. With the N+1 trim bits Trima<N:0> and Trimb<N:0>, the amplifiers, ampa, ampb, can be trimmed for zero offset, respectively.

Figure 3:
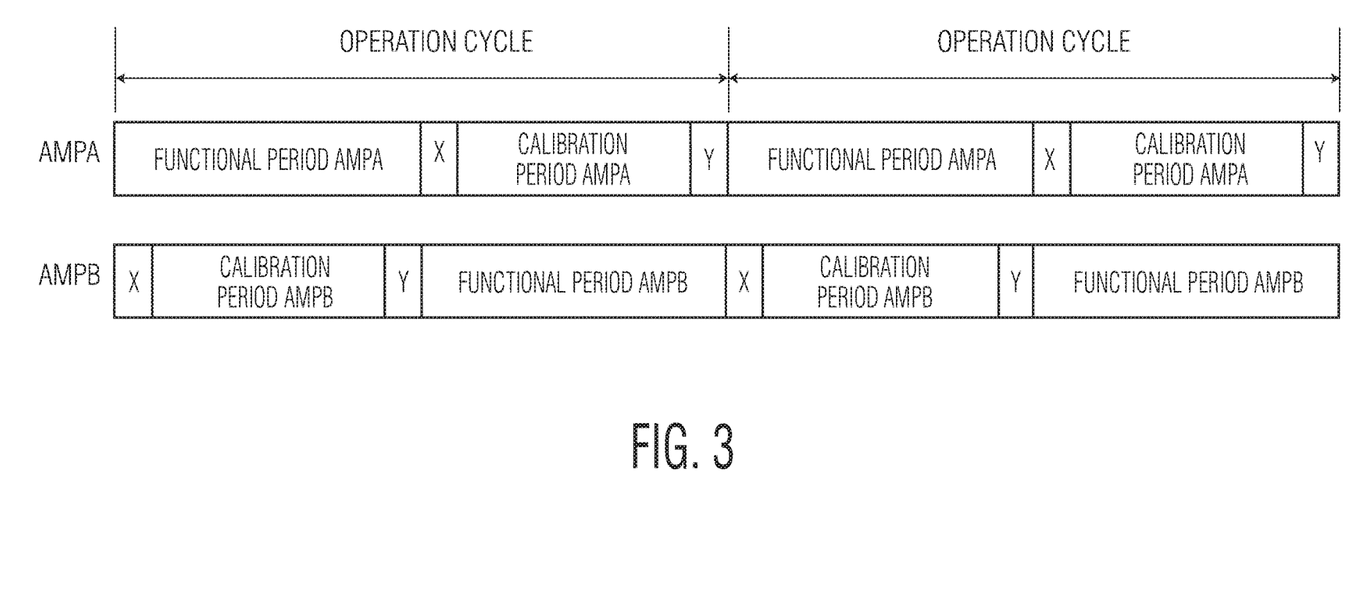
FIG. 3 illustrates an operation cycle timing diagram of the amplifier system depicted in FIG. 2.

In the embodiment depicted in FIG. 2, the digital control device 208 controls one of the amplifiers, ampa, ampb, to amplify an input signal into an output signal and calibrates the other one of the amplifiers simultaneously in discrete steps. The digital control device may perform multiple calibrations (e.g., trimmings) or continuous calibrations on the amplifiers ampa, ampb, across a temperature range. In some embodiments, the digital control device operates the amplifiers, ampa, ampb, in a functional period and a calibration period alternately. In the functional period, the amplifier ampa or ampb performs signal amplification by amplifying an input signal received at the input terminal 212 into an output signal to be output at the output terminal 214. In the calibration period, a temperature based calibration is performed on the amplifier ampa or ampb. FIG. 3 illustrates an operation cycle timing diagram of the amplifier system 200 depicted in FIG. 2. As illustrated in FIG. 3, in each operation cycle, the functional period of the amplifier, ampa, overlaps with the calibration period of the amplifier, ampb, and idle periods, "x," "y," of the amplifier, ampb, while the functional period of the amplifier, ampb, overlaps with the calibration period of the amplifier, ampa, and idle periods, x, y, of the amplifier, ampa.

In some embodiments, during the calibration of the amplifier, ampa, or ampb under a particular temperature, the digital control device 208 searches for the best trim code for the amplifier under trim for minimum offset. With the trim code, both positive and negative offsets can be forced upon the amplifier under trim. This forced offset is added onto the intrinsic offset already present in the amplifier under trim. By ramping the offset from negative to positive, the amplifier output of the amplifier under trim flips from low to high around the position where zero offset occurs and the corresponding offset code is stored or latched for the amplifier under trim.

In an example operation of the amplifier system 200, the digital control device 208 controls the operation of the amplifiers, ampa, ampb, by controlling or toggling the corresponding switches, S1, S2, S3, S4. At first, the digital control device calibrates the amplifier, ampa, while controlling the amplifier, ampb, to perform signal amplification. Specifically, the digital control device controls the switch, S1, to short together the inputs of the amplifier, ampa, which effectively turns the amplifier, ampa, into a comparator as the feedback network, fba, is rendered ineffective, and controls the switch, S2, to output the comparison result, "comp," to the digital control device. At the same time, the digital control device controls the switch, S3, to connect the input signal at the input terminal 212 to the input of the amplifier, ampb, and controls the switch, S4, to connect the output of the amplifier, ampb, to the output terminal 214. The gain of the amplifier, ampb, is dependent on the feedback network, fbb. Subsequently, the digital control device calibrates the amplifier, ampb, while controlling the amplifier, ampa, to perform signal amplification. Specifically, the digital control device controls the switch, S3, to short together the inputs of the amplifier, ampb, which effectively turns the amplifier, ampb, into a comparator as the feedback network, fbb, is rendered ineffective, and controls the switch, S4, to output the comparison result, comp, to the digital control device. At the same time, the digital control device controls the switch, S3, to connect the input signal at the input terminal to the input of the amplifier, ampa, and controls the switch, S2, to connect the output of the amplifier, ampa, to the output terminal. The gain of the amplifier, ampa, is dependent on the feedback network, fba.

Figure 4:
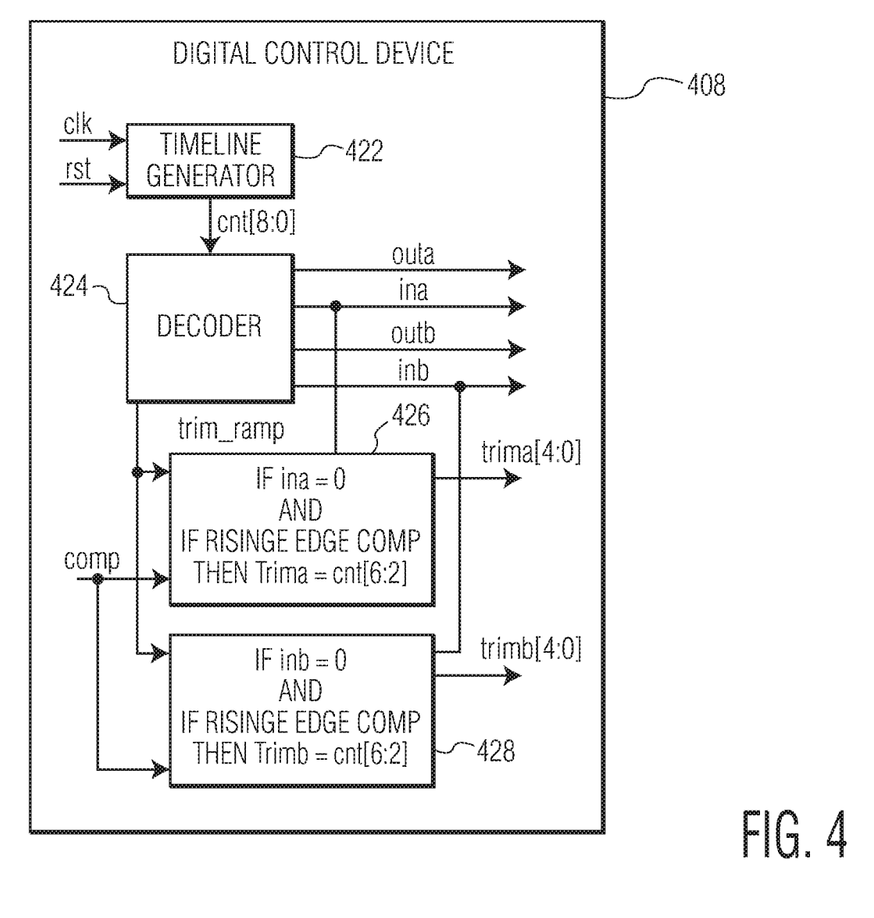
FIG. 4 depicts an embodiment of a digital control device of the amplifier system depicted in FIG. 2.

FIG. 4 depicts an embodiment of the digital control device 208 of the amplifier system 200 depicted in FIG. 2. In the embodiment depicted in FIG. 4, a digital control device 408 includes a timeline generator 422, a decoder 424, a first digital processor 426 and a second digital processor 428. The timeline generator, the decoder, the first digital processor and/or the second digital processor may be implemented in hardware (e.g., logical circuits), software (e.g., software instructions) stored in computer readable medium (e.g., memory, cache, or hard disks), and/or a combination of hardware and software. The digital control device 408 depicted in FIG. 4 is a possible implementation of the digital control device 208 depicted in FIG. 2. However, the digital control device depicted in FIG. 2 can be implemented differently from the digital control device depicted in FIG. 4.

In some embodiments, the timeline generator 422 may be configured to generate timing data (e.g., cnt[8:0]) for the decoder based on a clock signal, "clk," and a reset signal, "rst." The decoder 424 may be configured to generate control signals, ina, outa, inb, outb, for the switches, S1, S2, S3, S4, respectively, and a timing signal, "trim_ramp," for the first and second digital processors 426, 428, based on the timing data (e.g., cnt[8:0]). The first digital processor may be configured to generate trim code (e.g., trima [4:0]) for the first amplifier, ampa, based on the comparison result data, comp, from the first amplifier, ampa, the control signal, ina, for the switch, S1, and the timing signal, trim_ramp, from the decoder. In an example operation of the first digital processor, the first digital processor sets the trim code (e.g., trima [4:0]) to be equivalent to part of the timing data (e.g., cnt[6:2]) if the control signal, ina, for the switch, S1, is at logical low such that the inputs to the first amplifier, ampa, are connected together, and if there is a rising edge of the comparison result data, comp, from the first amplifier, ampa. The second digital processor may be configured to generate trim code (e.g., trimb [4:0]) for the second amplifier, ampb, based on the comparison result data, comp, from the second amplifier, ampb, the control signal, inb, for the switch, S3, and the timing signal, trim_ramp, from the decoder. In an example operation of the second digital processor, the second digital processor sets the trim code (e.g., trimb [4:0]) to be equivalent to part of the timing data (e.g., cnt[6:2]) if the control signal, inb, for the switch, S3, is at logical low such that the inputs to the second amplifier, ampb, are connected together, and if there is a rising edge of the comparison result data, comp, from the second amplifier, ampb.

Figure 5:
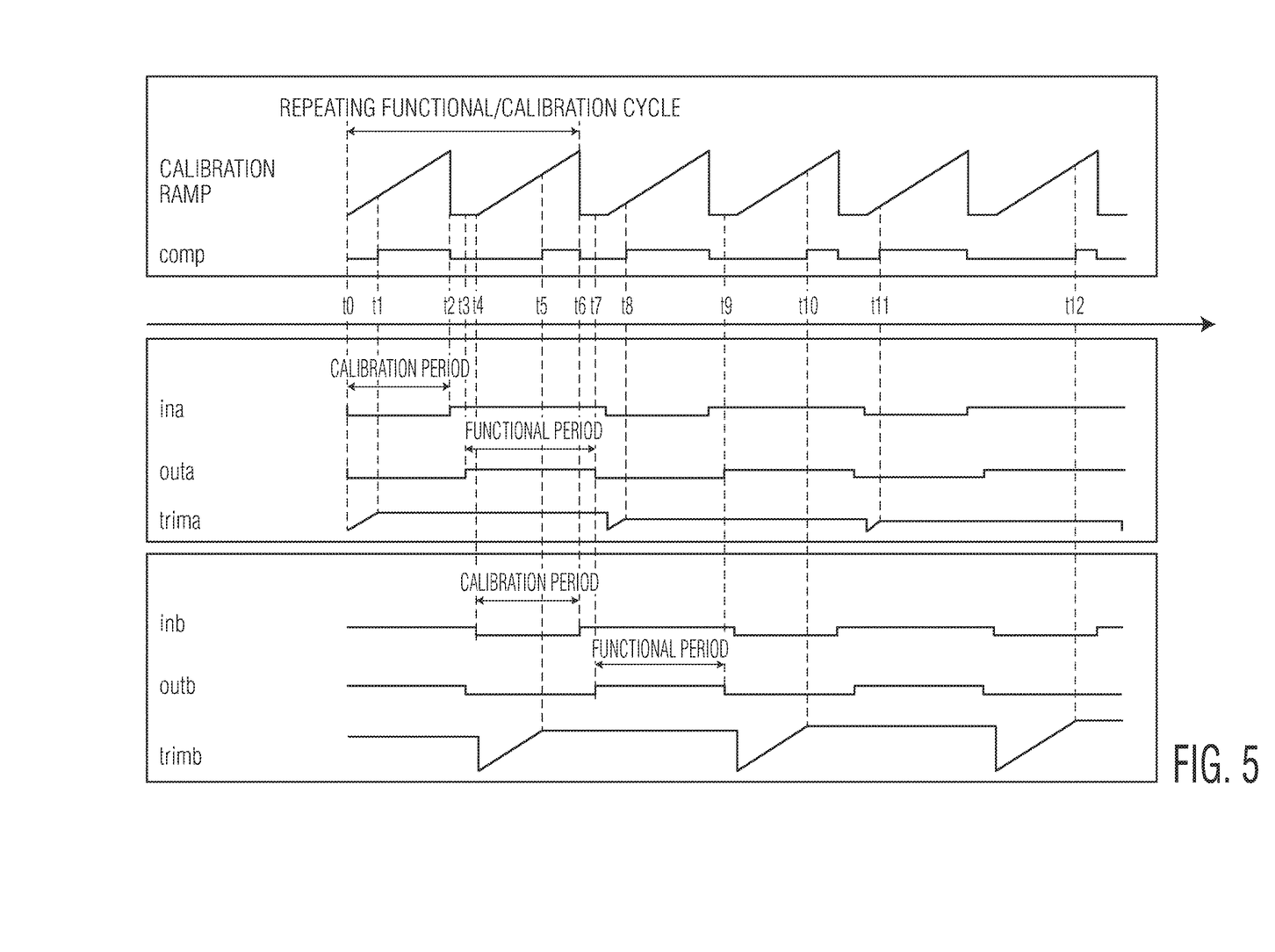
FIG. 5 illustrates a signal timing diagram of the digital control device depicted in FIG. 4.

FIG. 5 illustrates a signal timing diagram of the digital control device 408 depicted in FIG. 4. In the signal timing diagram illustrated in FIG. 5, control signals, ina, outa, inb, outb, for the switches, S1, S2, S3, S4, trim code, trima, for the amplifier, ampa, trim code, trimb, for the amplifier, ampb, the comparison result, comp, from the amplifier under trim (ampa or ampb), and the timing signal, trim_ramp, are placed according to the same timeline. At time point, "t0," the calibration period of the amplifier, ampa, starts, and the control signals, ina, outa, are set to logical low, to control the switches, S1, S2, to short the inputs of the amplifier, ampa, together, and to connect the output of the amplifier, ampa, (e.g., the comparison result, comp) to the digital control device 408 (e.g., to the first digital processor 426). In the signal timing diagram illustrated in FIG. 5, the timing signal, trim_ramp, rises from a minimum value, which corresponds to a minimum value (e.g., 00000 or other suitable value) of the trim code, trima or trimb, to a maximum value, which corresponds to a maximum value (e.g., 11111 or other suitable value) of the trim code, trima or trimb. At time point, "t1," at a rising edge of the comparison result, comp, the digital control device (e.g., the first digital processor 426) sets the trim code, trima, (e.g., to 01000 in a range between 00000 and 11111) for temperature based offset compensation of the amplifier, ampa, and the amplifier, ampa, is adjusted based on the trim code, trima, to reduce or eliminate offsets (e.g., intrinsic parameter offset or package stress related offset) within the amplifier, ampa. At time point, "t2," the calibration period of the amplifier, ampa, ends, the control signal, ina, is set to logical high, to control the switch, S1, to connect the input signal at the input terminal 212 to an input of the amplifier, ampa, and the comparison result, comp, from the amplifier, ampa, is set to logical low. At time point, "t3," the functional period of the amplifier, ampa, starts, and the control signal, outa, is set to logical high to control the switch, S2, to connect the output of the amplifier, ampa, to the output terminal 214.

At time point, "t4," the calibration period of the amplifier, ampb, starts, and the control signals, inb, outb, are set to logical low, to control the switches, S3, S4, to short the inputs of the amplifier, ampb, together, and to connect the output of the amplifier, ampb, (e.g., the comparison result, comp) to the digital control device 408 (e.g., to the second digital processor 428). At time point, "t5," at a rising edge of the comparison result, comp, the digital control device (e.g., the second digital processor 428) sets the trim code, trimb, (e.g., to 10011 in a range between 00000 and 11111) for temperature based offset compensation of the amplifier, ampb, and the amplifier, ampb, is adjusted based on the trim code, trimb, to reduce or eliminate offsets (e.g., intrinsic parameter offset or package stress related offset) within the amplifier, ampb. At time point, "t6," the calibration period of the amplifier, ampb, ends, the control signal, inb, is set to logical high, to control the switch, S3, to connect the input signal at the input terminal 212 to an input of the amplifier, ampb, and the comparison result, comp, from the amplifier, ampb, is set to logical low. At time point, "t7," the functional period of the amplifier, ampa, ends, the functional period of the amplifier, ampb, starts, and the control signal, outb, is set to logical high to control the switch, S4, to connect the output of the amplifier, ampb, to the output terminal 214.

At time point, "t8," at a rising edge of the comparison result, comp, from the amplifier, ampa, the digital control device (e.g., the first digital processor 426) sets the trim code, trima, (e.g., to 00101 in a range between 00000 and 11111) for temperature based offset compensation of the amplifier, ampa, and the amplifier, ampa, is adjusted based on the trim code, trima, to reduce or eliminate offsets (e.g., intrinsic parameter offset or package stress related offset) within the amplifier, ampa. At time point, "t9," the functional period of the amplifier, ampb, ends, the functional period of the amplifier, ampa, starts, and the control signal, outa, is set to logical high to control the switch, S2, to connect the output of the amplifier, ampa, to the output terminal 214.

At time point, "t10," at a rising edge of the comparison result, comp, from the amplifier, ampb, the digital control device (e.g., the second digital processor 428) sets the trim code, trimb, (e.g., to 10101 in a range between 00000 and 11111) for temperature based offset compensation of the amplifier, ampb, and the amplifier, ampb, is adjusted based on the trim code, trimb, to reduce or eliminate offsets (e.g., intrinsic parameter offset or package stress related offset) within the amplifier, ampb.

At time point, "t11," at a rising edge of the comparison result, comp, from the amplifier, ampa, the digital control device (e.g., the first digital processor 426) sets the trim code, trima, (e.g., to 00100 in a range between 00000 and 11111) for temperature based offset compensation of the amplifier, ampa, and the amplifier, ampa, is adjusted based on the trim code, trima, to reduce or eliminate offsets (e.g., intrinsic parameter offset or package stress related offset) within the amplifier, ampa.

At time point, "t12," at a rising edge of the comparison result, comp, from the amplifier, ampb, the digital control device (e.g., the second digital processor 428) sets the trim code, trimb, (e.g., to 11000 in a range between 00000 and 11111) for temperature based offset compensation of the amplifier, ampb, and the amplifier, ampb, is adjusted based on the trim code, trimb, to reduce or eliminate offsets (e.g., intrinsic parameter offset or package stress related offset) within the amplifier, ampb.

Although in the signal timing diagram illustrated in FIG. 5, the trim code, trima, for the amplifier, ampa, and the trim code, trimb, for the amplifier, ampb, can be set to certain values, in other embodiments, the trim code, trima, for the amplifier, ampa, and the trim code, trimb, for the amplifier, ampb, can be set to other values. In some embodiments, each of the trim code, trima, for the amplifier, ampa, and the trim code, trimb, for the amplifier, ampb, is adjusted step by step (e.g., the trim code is adjusted from M (M being a positive integer) to M−1 or from M−1 to M). In some other embodiments, each of the trim code, trima, for the amplifier, ampa, and the trim code, trimb, for the amplifier, ampb, is adjusted in bigger steps firstly and in smaller steps subsequently, until a desired calibration level is reached (e.g., when the comparison result, comp, from the amplifier under trim (ampa or ampb), reaches a predetermined pattern (e.g., 0101)). In addition, although in the signal timing diagram illustrated in FIG. 5, the timing signal, trim_ramp, rises from a lower value to a higher value, in other embodiments, the timing signal, trim_ramp, decreases from a maximum value, which corresponds to a maximum value (e.g., 11111 or other suitable value) of the trim code, trima or trimb, to a minimum value, which corresponds to a minimum value (e.g., 00000 or other suitable value) of the trim code, trima or trimb. In these embodiments, the trim code, trima or trimb, may be adjusted in response to a falling edge of the comparison result, comp, from the amplifier under trim (ampa or ampb).

Figure 6:
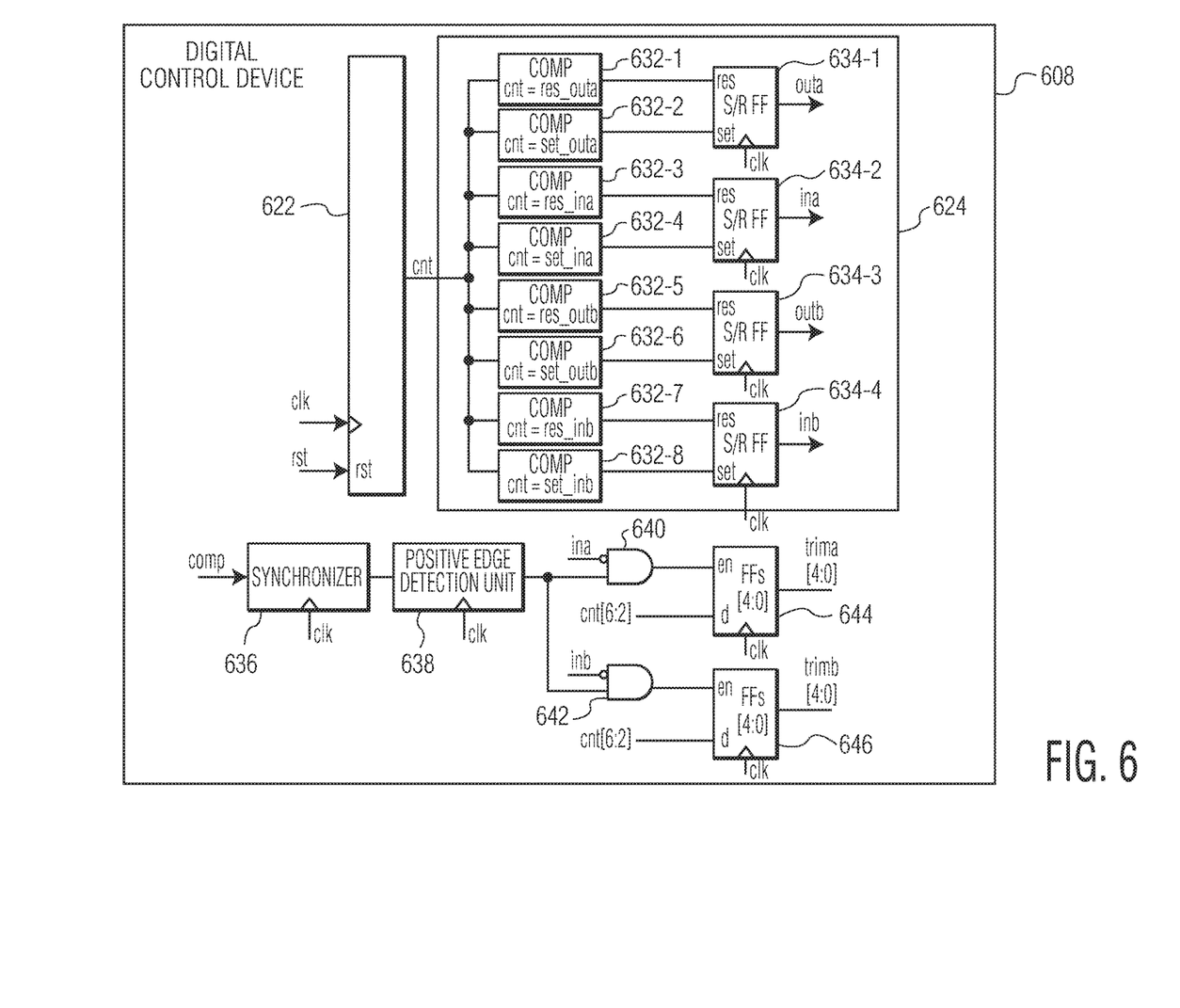
FIG. 6 depicts an embodiment of the digital control device depicted in FIG. 4.

FIG. 6 depicts an embodiment of the digital control device 408 depicted in FIG. 4. In the embodiment depicted in FIG. 6, a digital control device 608 includes a timeline generator 622, a decoder 624 that includes comparators 632-1, 632-2, 632-3, 632-4, 632-5, 632-6, 632-7, 632-8 and set-reset (S/R) flip-flop (FF)/latch circuits 634-1, 634-2, 634-3, 634-4, a synchronizer 636, a positive edge detection unit 638, AND gates with inverted inputs 640, 642, and flip-flop circuits 644, 646. The timeline generator, the decoder, the synchronizer, and/or the positive edge detection unit may be implemented in hardware (e.g., logical circuits), software (e.g., software instructions) stored in computer readable medium (e.g., memory, cache, or hard disks), and/or a combination of hardware and software. The digital control device 608 depicted in FIG. 6 is a possible implementation of the digital control device 408 depicted in FIG. 4. For example, the timeline generator 622, the decoder 624, the synchronizer, the positive edge detection unit, the AND gates with inverted inputs, and the flip-flop circuits 644, 646 depicted in FIG. 6 are embodiments of the timeline generator 422, the decoder 424, and/or the first and second digital processors 426, 428 depicted in FIG. 4, respectively. However, the digital control device depicted in FIG. 4 can be implemented differently from the digital control device depicted in FIG. 6.

In some embodiments, the timeline generator 622 may be configured to generate timing data (e.g., cnt[8:0]) for the decoder based on a clock signal, "clk," and a reset signal, "rst." Each of the S/R FF circuits 634-1, 634-2, 634-3, and 634-4 may be configured to generate control signals, ina, outa, inb, outb, for the switches, S1, S2, S3, S4, respectively, based on comparison results from a corresponding pair of comparators, 632-1 and 632-2, 632-3 and 632-4, 632-5 and 632-6, or 632-7 and 632-8. The synchronizer 636 is configured to perform synchronization on the comparison result signal, comp, from an amplifier under trim, ampa or ampb. The positive edge detection unit 638 is configured to detect positive edges of the comparison result signal, comp. The AND gate with inverted inputs 640 and the flip-flop circuit 644 may be configured to generate trim code (e.g., trima [4:0]) for the first amplifier, ampa, based on the comparison result data, comp, from the first amplifier, ampa, and the control signal, ina, for the switch, S1. The flip-flop circuit 644 may set the trim code (e.g., trima [4:0]) to be equivalent to part of the timing data (e.g., cnt[6:2]) if the control signal, ina, for the switch, S1, is at logical low such that the inputs to the first amplifier, ampa, are connected together, and if there is a rising edge of the comparison result data, comp, from the first amplifier, ampa. The AND gate with inverted inputs 642 and the flip-flop circuit 645 may be configured to generate trim code (e.g., trimb [4:0]) for the second amplifier, ampb, based on the comparison result data, comp, from the second amplifier, ampb, and the control signal, inb, for the switch, S3. The flip-flop circuit 646 may set the trim code (e.g., trimb [4:0]) to be equivalent to part of the timing data (e.g., cnt[6:2]) if the control signal, inb, for the switch, S3, is at logical low such that the inputs to the second amplifier, ampb, are connected together, and if there is a rising edge of the comparison result data, comp, from the second amplifier, ampb.

Figure 7:
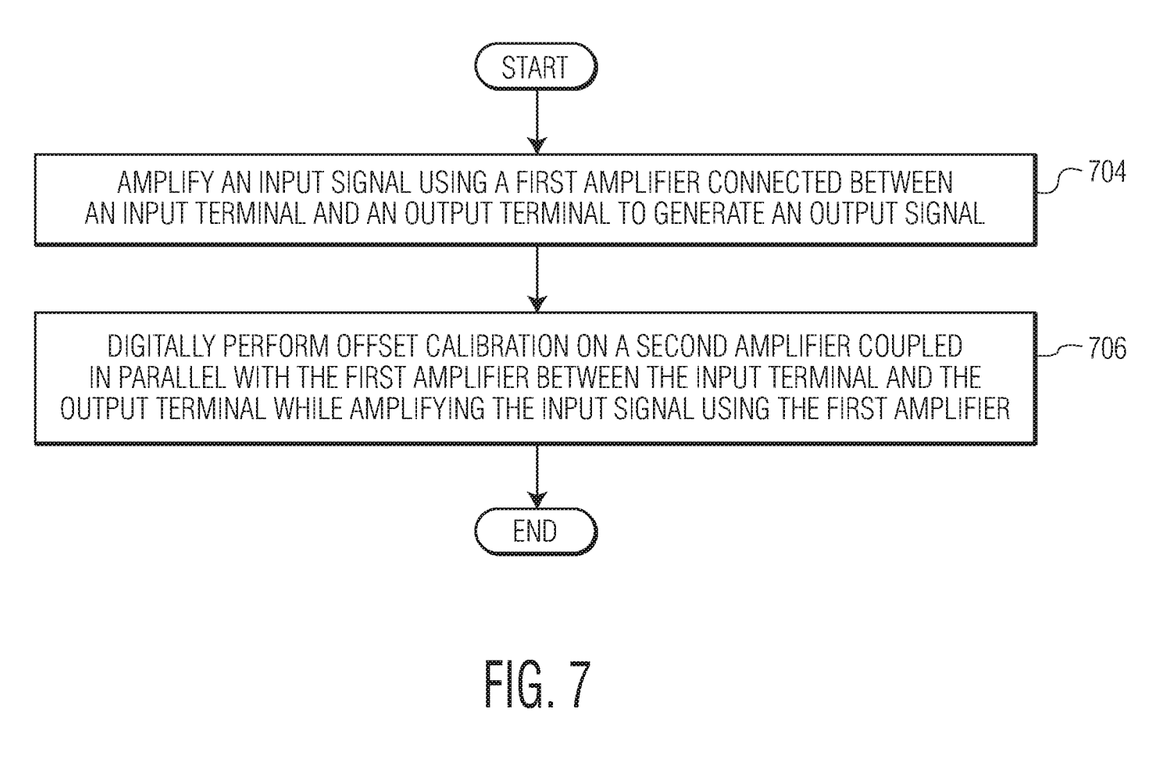
FIG. 7 is a process flow diagram that illustrates a method for amplifier calibration in accordance with an embodiment of the invention.

FIG. 7 is a process flow diagram that illustrates a method for amplifier calibration in accordance with an embodiment of the invention. At block 702, an input signal is amplified using a first amplifier connected between an input terminal and an output terminal to generate an output signal. At block 704, offset calibration is digitally performed on a second amplifier coupled in parallel with the first amplifier between the input terminal and the output terminal while amplifying the input signal using the first amplifier. The first and second amplifiers may be the same as or similar to the amplifiers 104-1, 104-2 depicted in FIG. 1 and/or the amplifiers ampa, ampb, depicted in FIG. 2. The input terminal may be the same as or similar to the input terminal 112 depicted in FIG. 1 and/or the input terminal 212 depicted in FIG. 2. The output terminal may be the same as or similar to the output terminal 114 depicted in FIG. 1 and/or the output terminal 214 depicted in FIG. 2.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method for amplifier calibration, the method comprising:
   amplifying an input signal using a first amplifier connected between an input terminal and an output terminal to generate an output signal; and
   digitally performing offset calibration on a second amplifier coupled in parallel with the first amplifier between the input terminal and the output terminal while at a same time amplifying the input signal using the first amplifier.

2. The method of claim 1,
   wherein digitally performing offset calibration on the second amplifier comprises reducing a temperature-based offset in the second amplifier.

3. The method of claim 2,
   wherein reducing the temperature-based offset in the second amplifier comprises adjusting the second amplifier to reduce temperature-based offsets in the second amplifier at a plurality of temperatures.

4. The method of claim 1,
   wherein digitally performing offset calibration on the second amplifier comprises generating a calibration code for reducing a temperature-based offset in the second amplifier at a particular temperature.

5. The method of claim 1, further comprising:
   connecting the first amplifier to the input terminal and the output terminal; and
   simultaneously disconnecting the second amplifier from the input terminal and the output terminal.

6. The method of claim 5,
   further comprising connecting two inputs of the second amplifier to each other.

7. The method of claim 6,
   wherein digitally performing offset calibration on the second amplifier comprises generating a calibration code for reducing a temperature-based offset in the second amplifier at a particular temperature based on an output from the second amplifier.

8. The method of claim 7,
   wherein digitally performing offset calibration on the second amplifier further comprises adjusting the second amplifier using the calibration code in response to a positive edge of the output from the second amplifier.

9. The method of claim 1, further comprising:
   amplifying a second input signal using the second amplifier to generate a second output signal; and
   digitally performing offset calibration on the first amplifier while amplifying the second input signal using the second amplifier.

10. An amplifier system, the amplifier system comprising:
    a first amplifier connected between an input terminal and an output terminal;
    a first switch device connected serially with the first amplifier between the input terminal and the output terminal;

a second amplifier coupled in parallel with the first amplifier between the input terminal and the output terminal;

a second switch device connected serially with the second amplifier between the input terminal and the output terminal; and a digital control device configured to:
    control the first switch device to cause an input signal to be amplified using the first amplifier to generate an output signal; and
    control the second switch device and the second amplifier to digitally perform offset calibration on the second amplifier while at a same time amplifying the input signal using the first amplifier.

11. The amplifier system of claim 10,
wherein the digital control device is further configured to reduce a temperature-based offset in the second amplifier.

12. The amplifier system of claim 11,
wherein the digital control device is further configured to adjust the second amplifier to reduce temperature-based offsets in the second amplifier at a plurality of temperatures.

13. The amplifier system of claim 10,
wherein the digital control device is further configured to generate a calibration code for reducing a temperature-based offset in the second amplifier at a particular temperature.

14. The amplifier system of claim 10, wherein the digital control device is further configured to:
    control the first switch device to connect the first amplifier to the input terminal and the output terminal; and
    control the second switch device to simultaneously disconnect the second amplifier from the input terminal and the output terminal.

15. The amplifier system of claim 14,
wherein the digital control device is further configured to control the second switch device to connect two inputs of the second amplifier to each other.

16. The amplifier system of claim 15,
wherein the digital control device is further configured to generate a calibration code for reducing a temperature-based offset in the second amplifier at a particular temperature based on an output from the second amplifier.

17. The amplifier system of claim 16,
wherein the digital control device is further configured to adjust the second amplifier using the calibration code in response to a positive edge of the output from the second amplifier.

18. The amplifier system of claim 10, wherein the digital control device is further configured to
    control the second switch device to amplify a second input signal using the second amplifier to generate a second output signal; and
    control the first switch device and the first amplifier to digitally perform offset calibration on the first amplifier while amplifying the second input signal using the second amplifier.

19. An amplifier system, the amplifier system comprising:
    a first amplifier connected between an input terminal and an output terminal;
    a first switch connected between the input terminal and the first amplifier;
    a second switch connected between the first amplifier and the output terminal;
    a second amplifier coupled in parallel with the first amplifier between the input terminal and the output terminal;
    a third switch connected between the input terminal and the second amplifier;
    a fourth switch connected between the second amplifier and the output terminal; and
    a digital control device configured to:
        control the first and second switches to cause an input signal to be amplified using the first amplifier to generate an output signal; and
        control the third and fourth switches and the second amplifier to digitally perform offset calibration on the second amplifier while at a same time amplifying the input signal using the first amplifier.

20. The amplifier system of claim 19, wherein the digital control device is further configured to
    control the third and fourth switches to amplify a second input signal using the second amplifier to generate a second output signal; and
    control the first and second switches and the first amplifier to digitally perform offset calibration on the first amplifier while amplifying the second input signal using the second amplifier.

* * * * *